United States Patent [19]

Wu

[11] Patent Number: 5,750,923

[45] Date of Patent: May 12, 1998

[54] ELECTRIC SHIELDING METAL SHELL RECEPTACLE HAVING MOVABLE BINDING STRIPS

[75] Inventor: Peter Wu, Taipei, Taiwan

[73] Assignee: Hsing Chau Industrial Co., Ltd., Taipei, Taiwan

[21] Appl. No.: 792,756

[22] Filed: Feb. 4, 1997

[51] Int. Cl.$^6$ .................................................. H05K 9/00
[52] U.S. Cl. ........................... 174/35 R; 174/35 GC; 361/818
[58] Field of Search ..................... 174/35 R, 35 C, 174/35 GC, 135, 65 R; 361/816, 818; 439/447, 470, 471, 472

[56] References Cited

U.S. PATENT DOCUMENTS 4,557,545  12/1985  Ohtsuki et al. .......................... 439/470

*Primary Examiner*—Kristine L. Kincaid
*Assistant Examiner*—Kristina Soderquist
*Attorney, Agent, or Firm*—Varndell Legal Group

[57] ABSTRACT

An electric shielding metal shell having two symmetrical rectangular-shaped metal casings connected together to hold a receptacle and an electric wire covered within a braided earthed tubes. The metal casings each having a respective binding strip that are connected to each other to hold the braided earthed tube and the electric wire. The binding strip of each metal casing respectively extends from a respective curved suspension strip, which suspends from a bottom wall of the respective metal casing, so that the binding strips of the metal casings can be moved relative to the metal casings, for permitting the electric wire to be bent smoothly to the desired angle.

1 Claim, 6 Drawing Sheets

ELECTRIC SHIELDING METAL SHELL RECEPTACLE HAVING MOVABLE BINDING STRIPS

BACKGROUND AND SUMMARY OF THE INVENTION

The present invention relates to an improvement made on the disclosure of U.S. Pat. No. 5,510,574, entitled "Electric Shielding Metal Shell for a Receptacle in a Computer Network System".

U.S. Pat. No. 5,510,574, issued to the present inventor, discloses an electric shielding metal shell, as shown in FIGS. 1 to 3, having two symmetrical rectangular-shaped metal casings connected together to hold a receptacle and an electric wire covered within a braided earthed tube. The metal casings each have a respective unitary, open loop-like binding strip that are connected to each other to hold the braided earthed tube and the electric wire. This structure of electric shielding metal shell is functional. However, this structure of electric shielding metal shell still has a drawback. Because the electric wire extends out of the wire hole longitudinally, it must be bent downwards or upwards if the receptacle is installed in a narrow area. However, if the electric wire is bent downwards or upwards at about 90° C. angle, the signal transmission quality of the electric wire may be affected.

The present invention has been accomplished to provide an electric shielding metal shell which eliminates the aforesaid problem.

According to the present invention, the binding strips are not fixedly connected to the rear walls of the metal casings. The bottom walls of the metal casings are punched into a respective punch hole and a respective curved suspension strip. The binding strips are respectively and integrally extended from the curved suspension strips, so that the binding strips of the metal casings can be moved relative to the metal casings, for permitting the electric wire to be bent smoothly to the desired angle.

DETAILED DESCRIPTION OF THE PREFERRED EMBODIMENT

Figure 1:
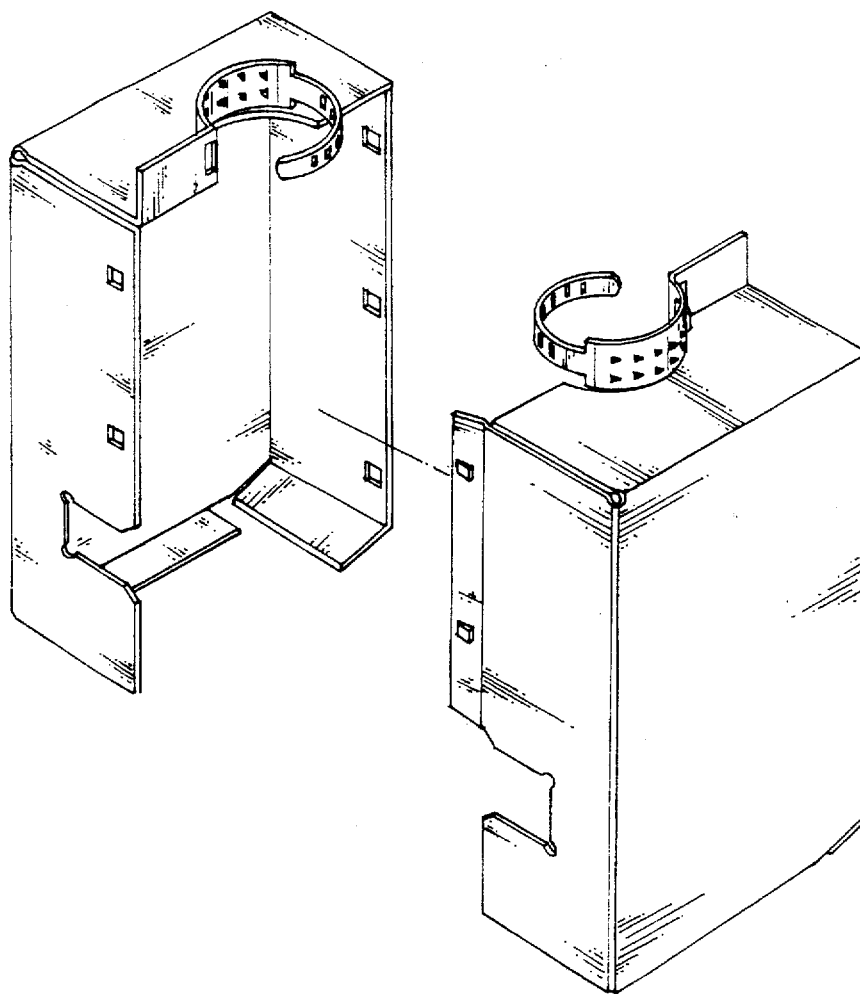
FIG. 1 an exploded view of an electric shielding metal shell according to the prior art.
Figure 2:
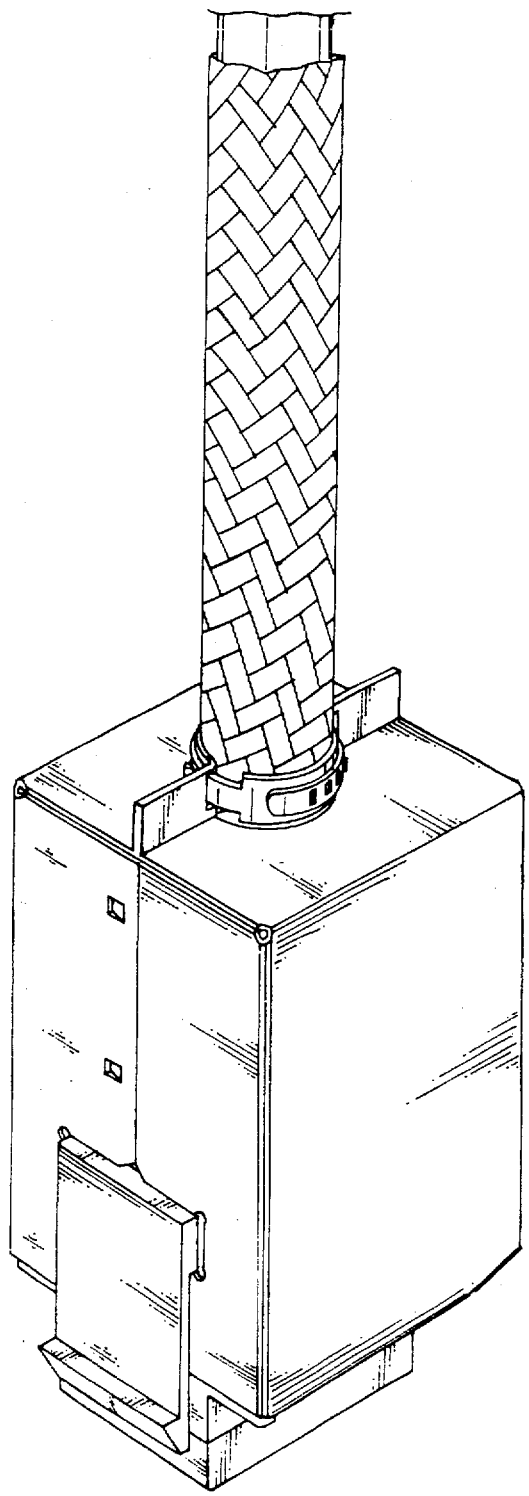
FIG. 2 shows the electric shielding metal shell of FIG. 1 mounted on a receptacle to hold down the electric wire.
Figure 3:
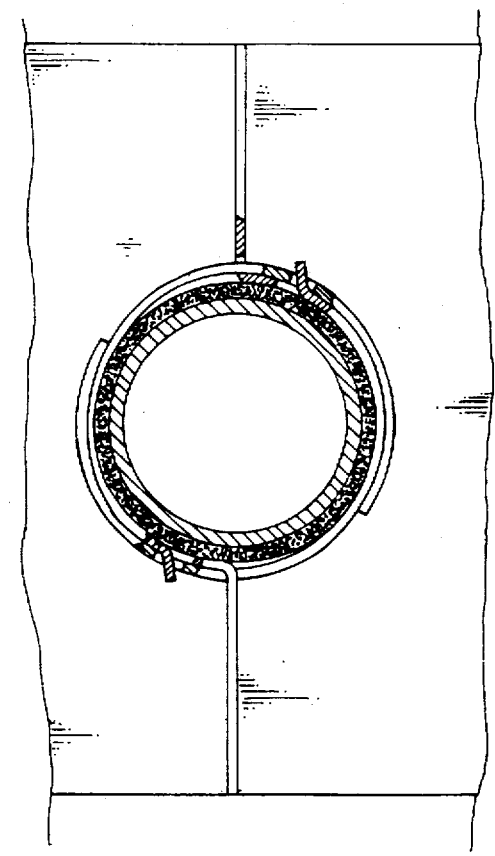
FIG. 3 a cross section of the electric shielding metal shell of FIG. 1, showing the electric wire clamped between the casings by the binding strips thereof.
Figure 4:
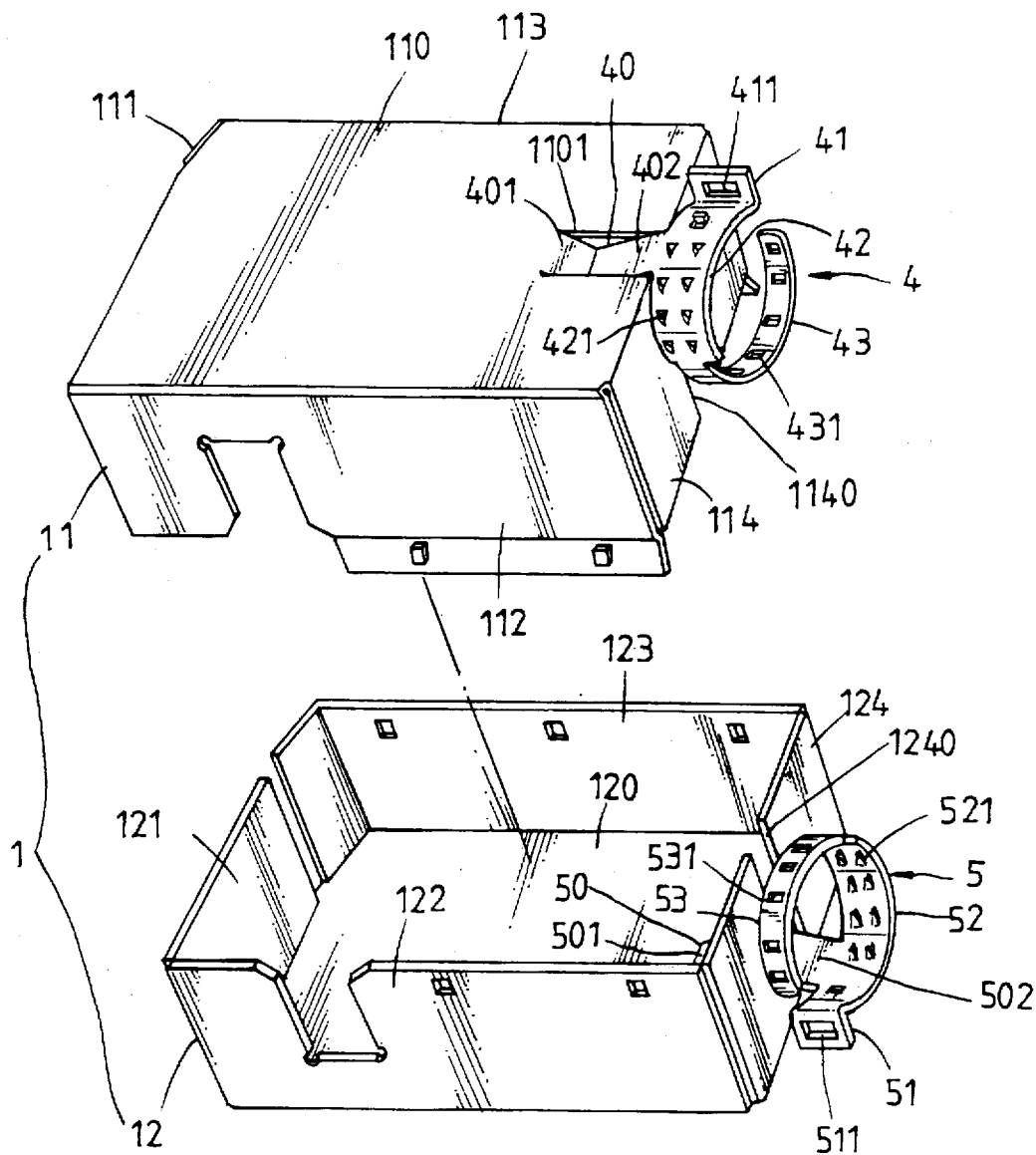
FIG. 4 is an exploded view of an electric shielding metal shell according to the present invention.
Figure 5:
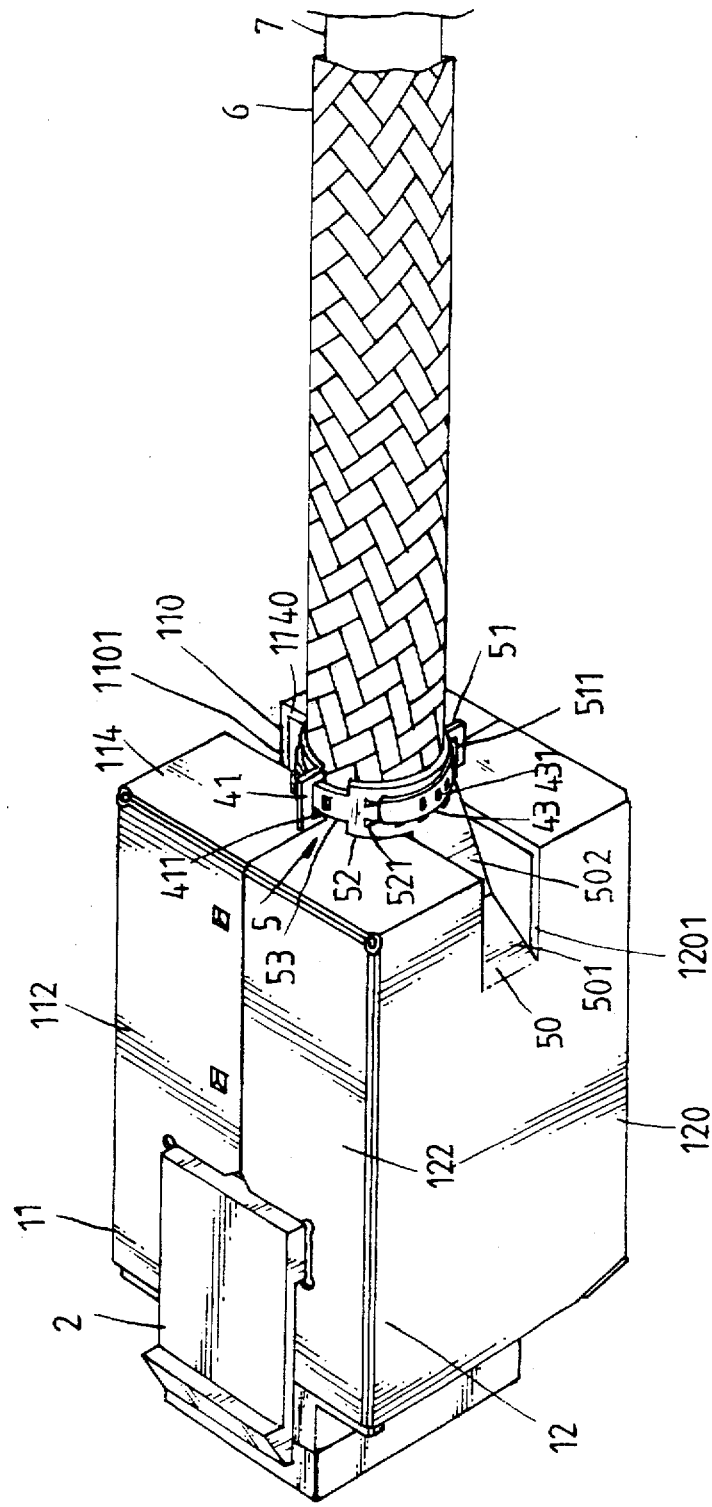
FIG. 5 shows the electric shielding metal shell of FIG. 4 mounted on a receptacle to hold down the electric wire.
Figure 6:
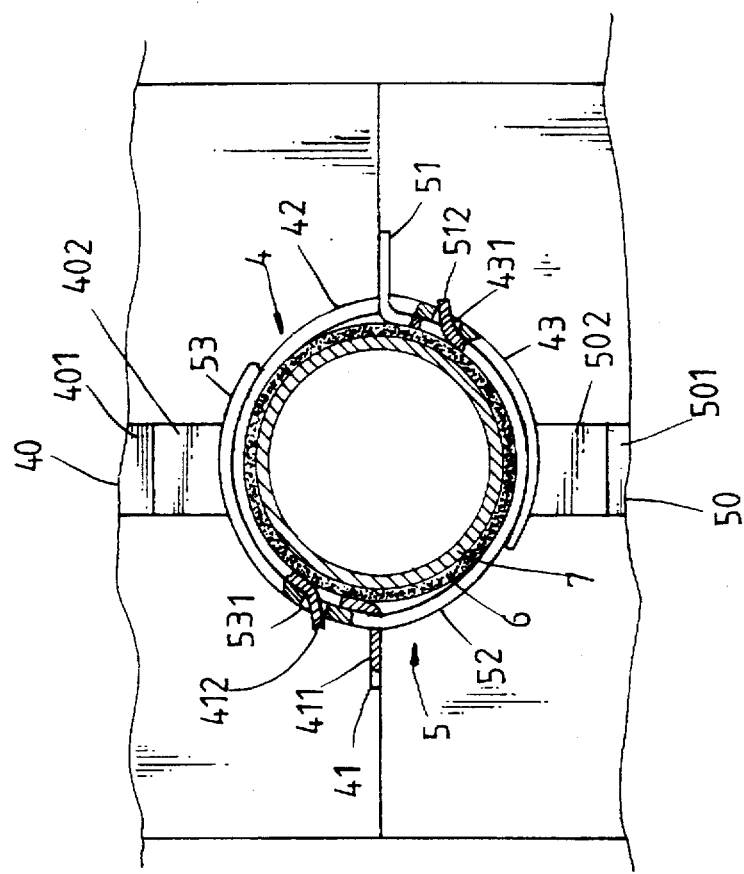
FIG. 6 is a cross section of the electric shielding metal shell of FIG. 4, showing the electric wire clamped between the casings by the binding strips thereof.

Referring to FIGS. 4 to 6, an electric shielding metal shell 1 is generally comprised of two symmetrical metal casings, namely, the upper casing 11 and the lower casing 12 connected together to hold a receptacle 2. The casing 11 or 12 is made of rectangular shape having a bottom wall 110 or 120, and four vertical walls, namely, the front wall 111 or 121, the rear wall 114 or 124, and two opposite side walls 112; 113 or 122; 123 respectively raised from the four sides of the bottom wall 110 or 120. A wire hole 1140 or 1240 is formed on the rear wall 114 or 124 of the casing 11 or 12 through which the electric wire 7 which is covered within a braided earthed tube 6 passes. Therefore, outside radiant rays are stopped from entering the receptacle 2, and inside electromagnetic waves are prohibited from escaping out of the electric shielding metal shell 1.

The rear wall 114 or 124 of the casing 11 or 12 comprises an extension wall punched into an unitary, open-loop like binding strip 4 or 5. The binding strips 4, 5 on the upper and lower casings 11, 12 are made in reversed directions so that they can be fastened around the braided earthed tube 6 to hold down the electric wire 7. The binding strips 4 or 5 comprises a flat front end 41 or 51 having a locating hole 411 or 511, an elongated tail 43 or 53 having a series of retaining holes 431 or 531, an arched middle portion 42 or 52 connected between the flat front end 41 or 51 and the elongated tail 43 or 53 and having a hook 412 or 512 near the locating hole 411 or 511 and a plurality of barbs 421 or 521 on an inner side.

When the upper and lower casings 11, 12 are connected together to hold the receptacle 2, the tail 43 or 53 of either binding strips 4 or 5 is respectively inserted into the locating hole 511 or 411 of the opposite binding strips 5 or 4 to hook on either retaining hole 531 or 431 of the opposite bindidng strips 5, and therefore the barbs 421; 521 respectively pierce into the braided earthed tube 6 to hold it in place.

The bottom wall 110 or 120 of the casing 11 or 12 is punched into a hole 1101 or 1201 and a curved suspension strip 40. The hole 1101 or 1201 is disposed in communication with the wire hole 1140 or 1240. The cuurved suspension strip 40 or 50 terminates in the periphery of the binding strip 4 or 5, that is, the curved suspension strip 40 or 50 and the binding strip 4 or 5 are made in integrity, and the binding strip 4 or 5 extends from the free end of the curved suspension strip 40 or 50. The curved suspension strip 40 or 50 comprises an inward section 401 or 501 projecting into the hole 1101 or 1201, and an outward section 402 or 502 projecting out of the hole 1101 or 1201 and having one end extended from the inward section 401 or 501 and an opposite end terminating in the periphery of the binding strip 4 or 5. Because the curved suspension strips 40, 50 suspend in the holes 1101, 1201 respectively and the binding strips 4, 5 are respectively extended from the curved suspension strips 40, 50, the binding strips 4, 5 can be moved relative to the casings 11, 12, for permitting the electric wire 7 to be smoothly bend to the desired direction.

I claim:

1. An electric shielding metal shell comprising first and second symmetrical and rectangular-shaped metal half shells connected together to form a container for holding a receptacle and an electric wire covered with a braided earthed tube, said first half shell having a first wire hole and a first binding strip arranged around said first wire hole, said second half shell having a second wire hole and a second binding strip arranged around said second wire hole, said electric wire extending out of said container through said holes and held in place by said first and second binding strips, said first and second metal half shells respectively having first and second punch holes adjacent said first and second wire holes, first and second projection strips are respectively arranged in said first and second punch holes and respectively extend from the bottom of said first and second metal half shells to said first and second binding strips, said first and second projection strips having a structure adapted for permitting movement of said first and second binding strips relative to said first and second metal half shells and for permitting said electric wire to be bent relative to said first and second metal half shells, said structure including each of said first and second projection strips having front and rear half sections joined together by a bent middle, said front half sections and said bent middles respectively located within said first and second punched holes and inside said first and second metal half shells, and said rear half sections respectively projecting out of said first and second punch holes, said first and second binding strips each having a flat front end with a locating hole, an elongated tail with a series of retaining holes, and an arched middle portion arranged between said flat front end and said elongated tail; said arched middle portions each having a locating slot, a hook and a plurality of barbs on an inner side thereof, wherein said first and second binding strips are fastened together by inserting said elongated tail of said first binding strip into said locating hole of said second binding strip and by inserting said tail of said second binding strip into said locating hole of said first binding strip, so that said hook of said first binding strip is received in one of said series of retaining holes of said second binding strip, said hook of said second binding strip is received in one of said series of retaining holes of said first binding strip, and said barbs of said first and second binding strips pierce said braided earthed tube.

* * * * *